US010211169B2

(12) United States Patent
Yoon et al.

(10) Patent No.: US 10,211,169 B2
(45) Date of Patent: Feb. 19, 2019

(54) GLASS INTERPOSER INTEGRATED HIGH QUALITY ELECTRONIC COMPONENTS AND SYSTEMS

(71) Applicant: University of Florida Research Foundation, Inc., Gainesville, FL (US)

(72) Inventors: Yong-Kyu Yoon, Gainesville, FL (US); Cheolbok Kim, Gainesville, FL (US); Hyup Jong Kim, Gainesville, FL (US); David Eliecer Senior, Cartagena Bolivar (CO)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 15/312,704

(22) PCT Filed: May 27, 2015

(86) PCT No.: PCT/US2015/032619
§ 371 (c)(1),
(2) Date: Nov. 21, 2016

(87) PCT Pub. No.: WO2015/183915
PCT Pub. Date: Dec. 3, 2015

(65) Prior Publication Data
US 2017/0186710 A1    Jun. 29, 2017

Related U.S. Application Data

(60) Provisional application No. 62/003,181, filed on May 27, 2014.

(51) Int. Cl.
*H01P 7/08* (2006.01)
*H01L 23/66* (2006.01)
(Continued)

(52) U.S. Cl.
CPC ............ *H01L 23/66* (2013.01); *H01L 21/486* (2013.01); *H01L 23/15* (2013.01);
(Continued)

(58) Field of Classification Search
CPC ......... H01L 23/49866; H01L 23/49827; H01L 23/49894; H01L 2223/6616; H01P 1/20381; H01P 7/08–7/088
See application file for complete search history.

(56) References Cited

U.S. PATENT DOCUMENTS 8,258,911 B2    9/2012  Fouquet
8,487,832 B2    7/2013  Lam et al.
(Continued)

FOREIGN PATENT DOCUMENTS

CN    103094681 A    5/2013
WO    2012027220 A2   3/2012

OTHER PUBLICATIONS

International Search Report for PCT/US2015/032619 dated Aug. 25, 2015.
(Continued)

*Primary Examiner* — Hoa C Nguyen
(74) *Attorney, Agent, or Firm* — Thomas Horstemeyer, LLP

(57) ABSTRACT

Various integrated high quality electronic components and systems, and methods of their manufacture, are presented. In one example, a device includes a glass substrate or interposer including one or more metalized through-glass vias (TGVs). The one or more metalized TGVs can be used to form a substrate integrated waveguide, a complementary split ring resonator, a disc loaded monopole antenna or other device. An array of metalized TGVs can define side walls of
(Continued)

the integrated waveguide. A disc coupled to a tip of a metalized TGV can provide capacitive disc loading of the monopole antenna.

19 Claims, 15 Drawing Sheets

(51) Int. Cl.
H01L 23/15 (2006.01)
H01L 23/498 (2006.01)
H01L 21/48 (2006.01)
H01P 1/203 (2006.01)
H01P 11/00 (2006.01)
H01Q 1/38 (2006.01)
H05K 1/03 (2006.01)

(52) U.S. Cl.
CPC .. *H01L 23/49827* (2013.01); *H01L 23/49838* (2013.01); *H01L 23/49866* (2013.01); *H01L 23/49894* (2013.01); *H01P 1/20381* (2013.01); *H01P 7/08* (2013.01); *H01P 11/003* (2013.01); *H01Q 1/38* (2013.01); H01L 2223/6616 (2013.01); H01L 2223/6677 (2013.01); H01L 2224/16145 (2013.01); H01L 2224/16227 (2013.01); H01L 2224/17181 (2013.01); H01L 2924/0002 (2013.01); H05K 1/0306 (2013.01); H05K 2201/10378 (2013.01)

(56) References Cited

U.S. PATENT DOCUMENTS

| | | | |
|---|---|---|---|
| 8,519,543 B1 | 8/2013 | Song et al. | |
| 2006/0273971 A1 | 12/2006 | Connor | |
| 2007/0262834 A1 | 11/2007 | Albacete et al. | |
| 2010/0090903 A1* | 4/2010 | Byun | H01Q 9/0407 343/700 MS |
| 2011/0018657 A1* | 1/2011 | Cheng | H01P 3/121 333/239 |
| 2011/0234240 A1* | 9/2011 | Yager | A61B 5/4875 324/634 |
| 2012/0045863 A1* | 2/2012 | Hopwood | C23C 16/24 438/57 |
| 2012/0048604 A1 | 3/2012 | Cornejo et al. | |
| 2012/0106117 A1* | 5/2012 | Sundaram | H01L 23/49827 361/808 |
| 2013/0040427 A1 | 2/2013 | Hu et al. | |
| 2013/0119555 A1* | 5/2013 | Sundaram | H01L 21/486 257/774 |
| 2013/0168860 A1 | 7/2013 | Karikalan et al. | |
| 2013/0242493 A1 | 9/2013 | Shenoy et al. | |
| 2014/0035935 A1* | 2/2014 | Shenoy | H01L 23/15 345/501 |
| 2014/0266974 A1* | 9/2014 | Sharawi | H01Q 21/28 343/893 |
| 2016/0013546 A1* | 1/2016 | Toyao | H01Q 1/243 343/904 |

OTHER PUBLICATIONS

Huang, L "Compact Half-Mode Substrate Integrated Waveguide Bandpass Filters With Capacitively Loaded Complementary Single Split Ring Resonators" Apr. 26, 2013, Microw. Opt. Technol. Lett., 55: 1602-1606. doi: 10.1002/mop.27604.

Hwangbo, S "Through Glass Via (TGV) Disc Loaded Monopole Antennas for Millimeter-Wave Wireless Interposer Communication" May 26, 2015, Electronic Components and Technology Conference (ECTC), 2015 IEEE 65th, pp. 999-1004, INSPEC 15303965, DOI: 10.1109/ECTC.2015.7159717.

Moyer, "Glass Interposers", Electronic Engineering Journal, Jan. 6, 2014, http://www.eejournal.com/archives/articles/20140106-interposers/, 7 pages.

English Translation of the Abstract for CN103094681 published mailed May 8, 2013.

"Equipos de Radiocomunicaciones" Inicio, RF Components, 3 pages, https://web.archive.org/web/20140423115950/http://www.rfcomponents.com/.

* cited by examiner

TABLE 1. Design parameters of the filters on glass

| Filter | $f_0$ (GHz) | 20 dB RL FBW | $Q_e$ | $M_{12}$ | $M_{23}$ |
|---|---|---|---|---|---|
| Two poles | 5.8 | 12% | 5.8 | 0.1994 | - |
| Three poles | 5.8 | 14% | 6.083 | 0.1444 | 0.1444 |

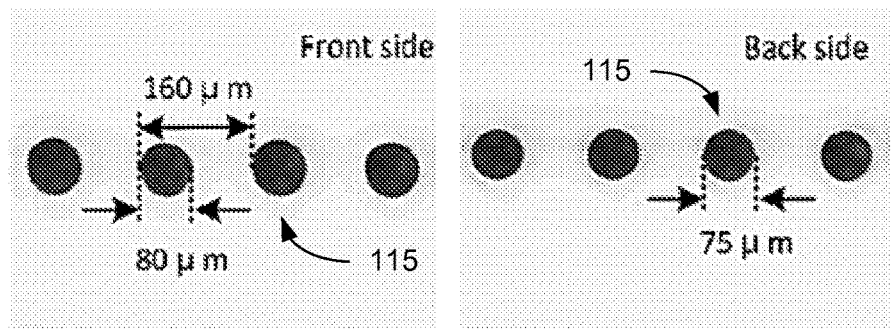
FIG. 7
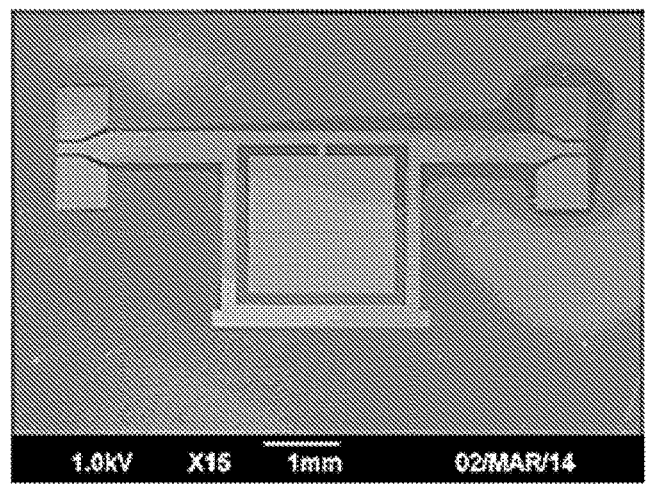
FIG. 8
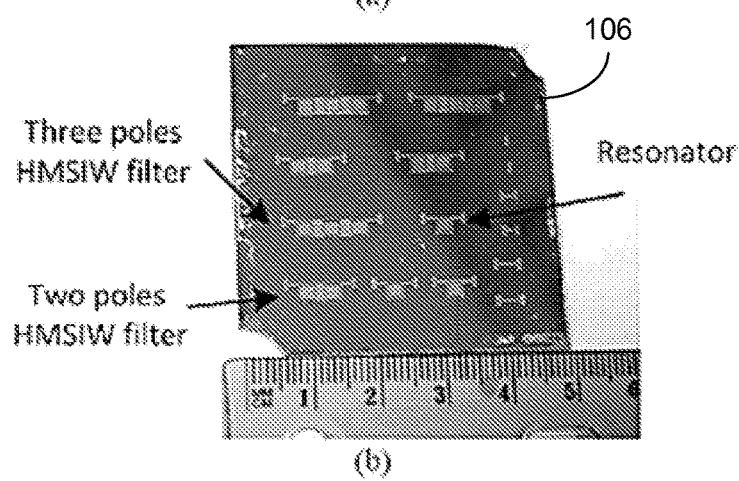

Table 2. Summary of the results for CSRR-loaded HMSIW devices

|  | Resonator | | Two poles | | Three poles | |
| --- | --- | --- | --- | --- | --- | --- |
|  | Sim. | Mea. | Sim. | Mea. | Sim. | Mea. |
| $f_0$ (GHz) | 5.84 | 5.63 | 5.81 | 5.76 | 5.77 | 5.79 |
| BW (GHz) | 2.16 | 1.95 | 1.29 | 1.22 | 1.03 | 0.98 |
| $Q_e$ | 5.4 | 5.76 | | | | |
| IL (dB) | 0.34 | 0.35 | 0.60 | 0.79 | 0.94 | 1.35 |
| RL (dB) | 36.4 | 28.7 | | | | |

# GLASS INTERPOSER INTEGRATED HIGH QUALITY ELECTRONIC COMPONENTS AND SYSTEMS

CROSS REFERENCE TO RELATED APPLICATIONS

This application is the 35 U.S.C. § 371 national stage application of PCT Application No. PCT/US2015/032619, filed May 27, 2015, which claims priority to, and the benefit of, co-pending U.S. provisional application entitled "GLASS INTERPOSER INTEGRATED HIGH QUALITY ELECTRONIC COMPONENTS AND SYSTEMS" having Ser. No. 62/003,181, filed May 27, 2014, both of which are hereby incorporated by reference in their entirety.

STATEMENT REGARDING FEDERALLY SPONSORED RESEARCH OR DEVELOPMENT

This invention was made with government support under Agreement No. ECCS-1132413 awarded by the National Science Foundation. The Government has certain rights in the invention.

BACKGROUND

Silicon interposers have been used to in packaged integrated circuits (ICs). The silicon interposer acts as a miniaturized printed circuit board (PCB) that can be used to implement wireless devices for 3D (or 2.5D) integrated circuits or system on package (SoP) platforms. Through-silicon vias (TSVs) provide routing paths through the silicon interposer between dies mounted on opposite sides of the silicon interposer. However, silicon is an expensive interposer with relatively low resistivity (or large electrical conductivity). The silicon interposer can therefore suffer from substrate loss and interference from neighboring signal traces.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 3(a) and 3(b) include graphical representations of top views of examples of two-pole and three-pole bandpass filters in accordance with various embodiments of the present disclosure.

FIG. 7 includes scanning electron microscope (SEM) images of through-glass vias (TGVs) in a glass substrate in accordance with various embodiments of the present disclosure.

FIGS. 8(a) and 8(b) are SEM and optical images of various electronic components fabricated on a glass substrate in accordance with various embodiments of the present disclosure.

DETAILED DESCRIPTION

Figure 1:
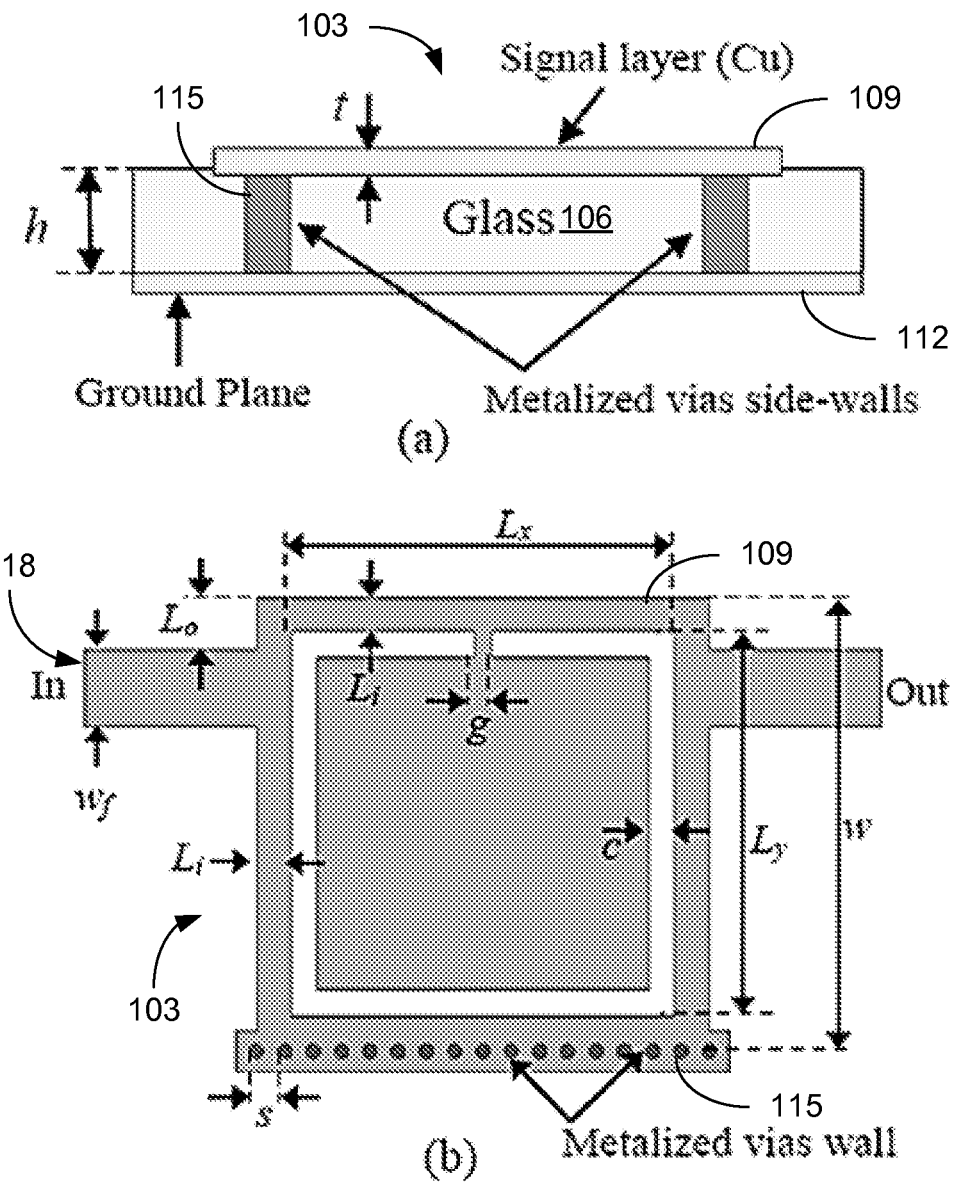
FIGS. 1(a) and 1(b) include graphical representations of (a) cross-sectional and (b) top views of an example of a half mode substrate integrated waveguide (HMSIW) resonator in accordance with various embodiments of the present disclosure.

Disclosed herein are various examples related to glass interposer integrated high quality electronic components and systems, and methods of their manufacture. Reference will now be made in detail to the description of the embodiments as illustrated in the drawings, wherein like reference numbers indicate like parts throughout the several views.

Through-glass interposers (TGIs) offer an improvement over through-silicon interposers (TSIs) because of their low substrate loss in the RF/microwave range, the mechanical robustness and low material and manufacturing cost. The Corning fusion process can be used to provide pristine surface glass substrates and through-glass via (TGV) processes such as wet and dry etching, laser drilling, and w-plug, can be used to fabricate the vias. The high quality factor (Q-factor) radio frequency (RF) performance of a resonator on the glass interposer indicates that it can be a good hosting medium for high quality RF circuits such as bandpass filters (BPFs), supporting modern devices required for system on package (SoP) and system on chip (SoC) technologies.

Substrate integrated waveguide (SIW) technology can be a good candidate to achieve a higher level of integration. SIW devices utilize a planar-type waveguide architecture with two metallic plates on the upper and bottom sides of the substrate connected by side-walls made of arrays of metalized vias. This architecture can be used to produce microwave and millimeter wave components with simple design, high quality factor with low loss substrates, high power handling capability, high integrability with other planar circuits and low manufacturing cost.

In order to reduce the size of SIW devices, reduced mode versions of the SIW technique such as the half mode substrate integrated waveguide (HMSIW), the quarter mode substrate integrated waveguide (QMSIW), the eighth mode substrate integrated waveguide (EMSIW), and/or other higher mode substrate integrated waveguide (HMSIW) can be used. Further size reduction may also be realized with the inclusion of metamaterial resonators, such as complementary split-ring resonators (CSRRs). A CSRR designed to have a negative effective permittivity at its resonance frequency, can be combined with the SIW and HMSIW structures, to generate a forward-wave transmission band below the waveguide original cutoff frequency. The operation mode is completely different from a conventional TE10 waveguide mode, thanks to the principle of evanescent wave amplification.

High quality and compact electronic components and/or systems (e.g., RF devices), which use the half mode substrate integrated waveguide (HMSIW) architecture loaded with the complementary split ring resonator (CSRR), can be implemented on a glass interposer layer, which serves as an interconnection layer and as a host medium for integrated passive RF components. Compared with the silicon interposer approach, which suffers from large electrical conductivity and therefore substrate loss, the glass interposer has advantages of low substrate loss, allowing high quality interconnection and passive circuits, and low material and manufacturing costs. Corning fusion glass can be used as the substrate to realize the compact CSRR-loaded HMSIW resonators and bandpass filters (BPFs) working under the principle of evanescent wave amplification. Other types of glass may also be used for the glass substrate. Through-glass vias (TGVs) can be used to define the side-wall of the SIW structure. TGVs can be also used for radiation components such as antennas, through which wireless communication channels in the interposer layer or over the interposer layer can be formed.

The use of a glass interposer working as a hosting medium for the high quality compact RF components as well as the conventional interconnecting layer is discussed herein. The components can include, but are not limited to, passive devices such as, e.g., inductors, capacitors, resonators, couplers, transformers, baluns and/or antennas (e.g., monopole antennas, multi-pole antennas, and/or leaky wave antennas). Also, an implementation of high quality substrate integrated waveguide RF components using glass substrate is detailed.

For example, two and three pole bandpass filters were designed for broadband operation at 5.8 GHz. Higher order filters (e.g., four-pole, five-pole, etc.) may also be implemented. Broadband bandpass filter operation, instead of narrowband one, was selected to demonstrate the merits of the glass substrate as a hosting material for the integrated waveguiding structures with advanced RF passive and metamaterial circuit architectures.

The Corning glass process offers attributes such as, e.g., a pristine surface, low thickness variation and excellent flatness, the ability to scale to large wafer and panel formats as well as via forming in various thicknesses to a few tens of micrometers (μm) and millimeters, which can allow cost effective processes. Surface micromachining techniques can be used to fabricate the SIW devices. Direct integration of TGVs and other passive RF components produces high integrability, low component loss, small device form factor, manufacturability and low cost. The low RF loss and low parasitic capacitance of the high-quality fusion glass enhance the operating frequency range to a level that may not be achieved by the silicon interposer counterpart. The HMSIW architecture can be utilized to show the superiority of the low loss glass substrate, where the TGVs form side-walls for the electromagnetic waveguide in the glass interposer substrate.

Based on an evanescent wave HMSIW resonator, two-pole and three-pole bandpass filters can be demonstrated using the HMSIW resonator loaded with a single ring CSRR (or CSRR-loaded HMSIW resonator) for broadband operation covering the ISM band of 5.8 GHz. A single ring CSRR was used instead of a double ring CSRR in order to achieve a wider bandwidth. The variations of the external quality factor ($Q_e$) of the resonator and the internal coupling coefficient (M) of the coupled resonators were studied for the filter design. Operation of the filters at 5.8 GHz with a fractional bandwidth (FBW) of more than 10% for an in-band return loss of better than 20 dB and an insertion loss of less than 1.35 dB was obtained, which is not feasible with a usual silicon interposer approach.

Corning fusion glass substrates can be used to implement electronic components such as the CSRR-loaded HMSIW resonator and filters. The Corning fusion glass fabrication process allows for the creation of via holes in the glass substrate using different fabrication methods including, e.g., mechanical and laser drilling. FIG. 1 provides a graphical representation of a CSRR-loaded HMSIW resonator 103 on a glass substrate 106. As shown in the cross-sectional view of FIG. 1(a), the SIW architecture on the glass substrate 106 includes a signal layer 109, which can be formed of copper (Cu), disposed on a first side of the glass substrate 106 and a ground plane 112 disposed on a second side of the glass substrate 106. In some implementations, the ground plane 112 may be replaced by a second signal layer disposed on the second side of the glass substrate 106. A plurality of metalized vias extend between the signal layer 109 and ground plane 112 through TGVs 115 formed in the glass substrate 106.

To fabricate the CSRR loaded HMSIW resonator 103, a glass substrate 106 with a thickness h of about 300 μm was used. The thickness of the glass substrate 106 can range from 10's of micrometers to a few millimeters. The glass substrate 106 was characterized as having an electrical permittivity of 5.8 and a loss tangent of 0.0042 at 5 GHz. The diameter of the TGVs 115 was about 80 μm. Metallization of the ground plane 112, TGVs 115 and the signal layer 109 can be performed using DC-sputtering and subsequent copper (Cu) electroplating with a Cu thickness of, e.g., about 10 μm. This thickness is more than five times the skin depth of copper at 5.8 GHz and can be used to reduce RF conductor losses. FIG. 1(a) shows the cross section of an example of a SIW device on a glass substrate 106, where the metalized via holes 115 define the metallic side-walls.

A split ring resonator (SRR), a spiral inductor, a solenoid inductor, a toroid inductor, a composite right and left handed (CRLH) transmission line and/or a mushroom structure based metamaterial component may also be implemented. A solenoid inductor can be provided with the top conductors patterned on the first side of the glass substrate 106, the bottom conductors patterned on the second side of the glass substrate 106, and the side conductors are formed by the metalized vias. A transformer can be formed in a solenoid and toroid shape, and in a spiral shape.

FIG. 1(b) is a top view showing an example of the layout of the signal layer 109 for a CSRR-loaded HMSIW resonator 103. In the example of FIG. 1(b), a single ring CSRR is used. Although the use of the single ring CSRR offers a higher resonance frequency and thus a larger size than that offered by the use of a double ring CSRR, the out-of-band frequency response of the HMSIW resonator is better with higher order harmonics suppressed. In other embodiments, a SIW, a QMSIW, an EMSIW, and HMSIW with various shapes of slits including circular, triangular, square, rectangular slits and/or a combination thereof may be implemented. Metalized vias are used as the side-walls for the cavity. The TGVs 115 forming the side-wall had a diameter of about 80 μm with a center-to-center pitch of s=160 μm.

Variations of the external quality factor $Q_e$ and the coupling coefficient of coupled resonators M are first obtained for a coupled resonator bandpass filter design. The layout of FIG. 1(b) is used to describe the working principle of the CSRR-loaded HMSIW resonator 103. The effective width w of the HMSIW controls the waveguide cutoff frequency $f_c$. A direct connection of a 50 Ω microstrip line 118 can be used to excite the CSRR-loaded HMSIW resonator 103, as shown in FIG. 1(b). The external quality factor $Q_e$ can be controlled by either the offset distance $L_o$ or the internal offset distance $L_i$. The geometrical parameters of the CSRR control the main resonance frequency of the resonator 103. The total length of the CSRR is initially selected as one half of the guided wavelength $\lambda_g$ at the center frequency $f_o$. Since this is an evanescent wave resonator, the cutoff frequency of the waveguide is higher than the designed resonance frequency of the CSRR-loaded HMSIW resonator 103. Therefore, the CSRR loading allows for a more compact resonator.

Figure 2:
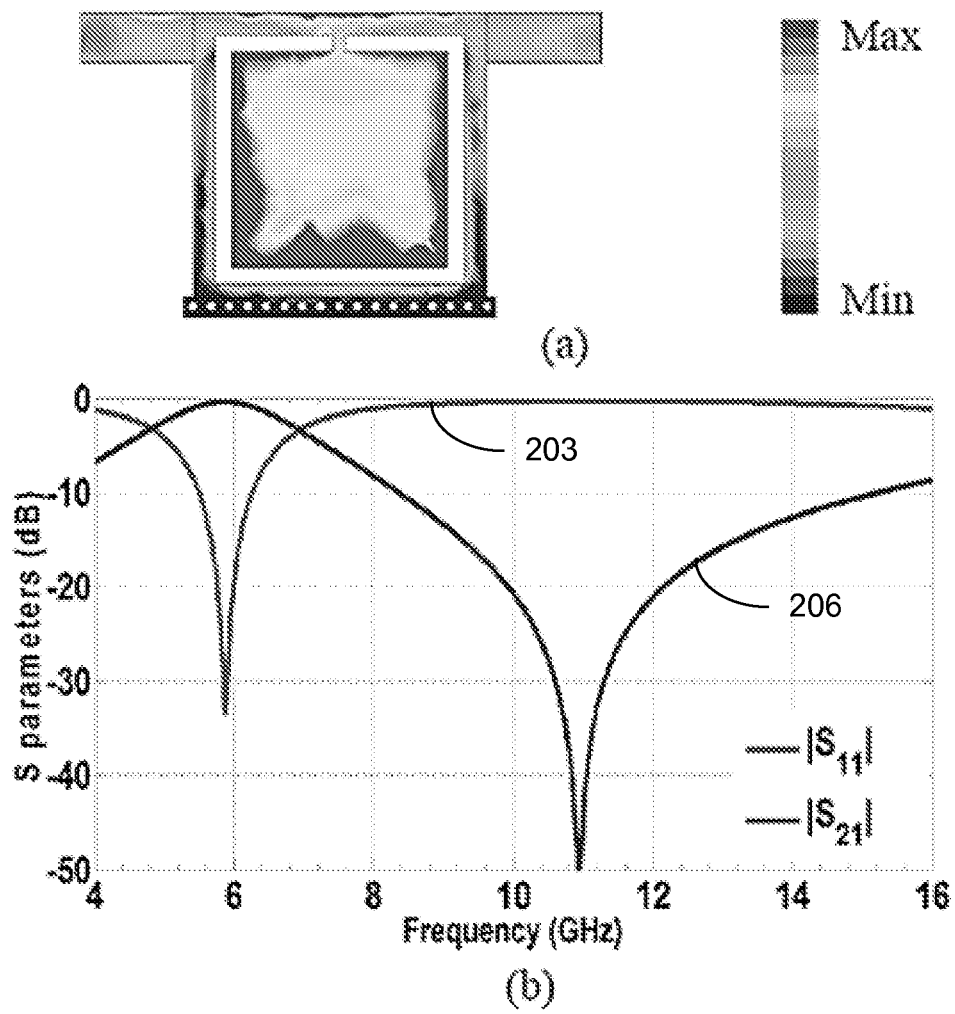
FIGS. 2(a) and 2(b) include examples of plots of (a) electric field distribution and (b) frequency response for the HMSIW resonator of FIG. 1 in accordance with various embodiments of the present disclosure.

Referring to FIG. 2, shown are plots of (a) electric field distribution and (b) frequency response for the single-ring CSRR-loaded HMSIW resonator 103. FIG. 2(a) illustrates the electric field distribution at the resonance frequency for the CSRR-loaded HMSIW resonator 103. The cavity was designed and optimized to resonate at 5.8 GHz. A double loaded cavity allows for the easy calculation of the external quality factor $Q_e$ as follows:

$$Q_e = \frac{2f_o}{BW_{3dB}}, \quad (1)$$

where $f_o$ is the resonance frequency and $BW_{3dB}$ is the 3 dB bandwidth of the HMSIW resonator 103. An external quality factor $Q_e$ of 5.4 was obtained from full wave 3D structure simulations. Examples of $|S_{11}|$ (curve 203) and $|S_{21}|$ (curve 206) are illustrated in FIG. 2(b). The dimensions were w=2.62 mm, $w_f$=0.45 mm, $L_x$=$L_y$=2.22 mm, s=160 μm, c=0.15 mm, g=0.1 mm, $L_o$=0 mm, $L_i$=0.2 mm. The resonant mode shows that the electric field is confined around the CSRR. The obtained resonance frequency is 5.8 GHz, which is below the TE10 cutoff frequency of the original HMSIW structure (12 GHz), indicating that the working principle follows the evanescent mode amplification. The size of the CSRR-loaded HMSIW resonator 103 on the glass substrate 106 is about 0.122$\lambda_g$×0.122$\lambda_g$, where $\lambda_g$ is the guided wavelength at 5.8 GHz.

Figures 3, 4:
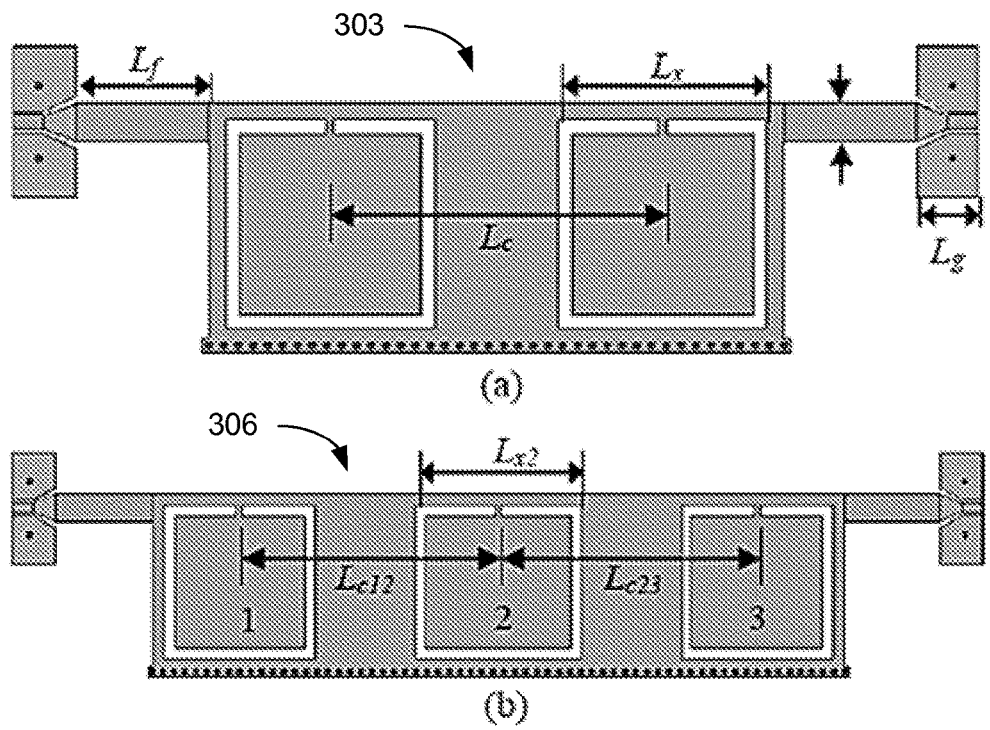
FIG. 4 is a table listing an example of design parameters for filters on a glass substrate in accordance with various embodiments of the present disclosure.

To demonstrate the use of a CSRR-loaded HMSIW cavity, two-pole and three-pole Chebyshev bandpass filters were designed for operation at a center frequency of 5.8 GHz with a 20 dB return loss FBW of more than 10%. FIG. 3(a) shows the configuration of the two-pole BPF 303 and FIG. 3(b) shows the configuration of the three-pole BPF 306. A coupled resonator design methodology was followed and initial dimensions were obtained to achieve the desired performance. The external quality factor $Q_e$ of the double loaded resonator and the coupling coefficient M of the coupled resonators were determined through electromagnetic simulations. The design parameters of the two-pole and three-pole Chebyshev bandpass filters are shown in Table 1 of FIG. 4. The initial dimensions were further optimized through full wave structure simulations.

Figure 5:
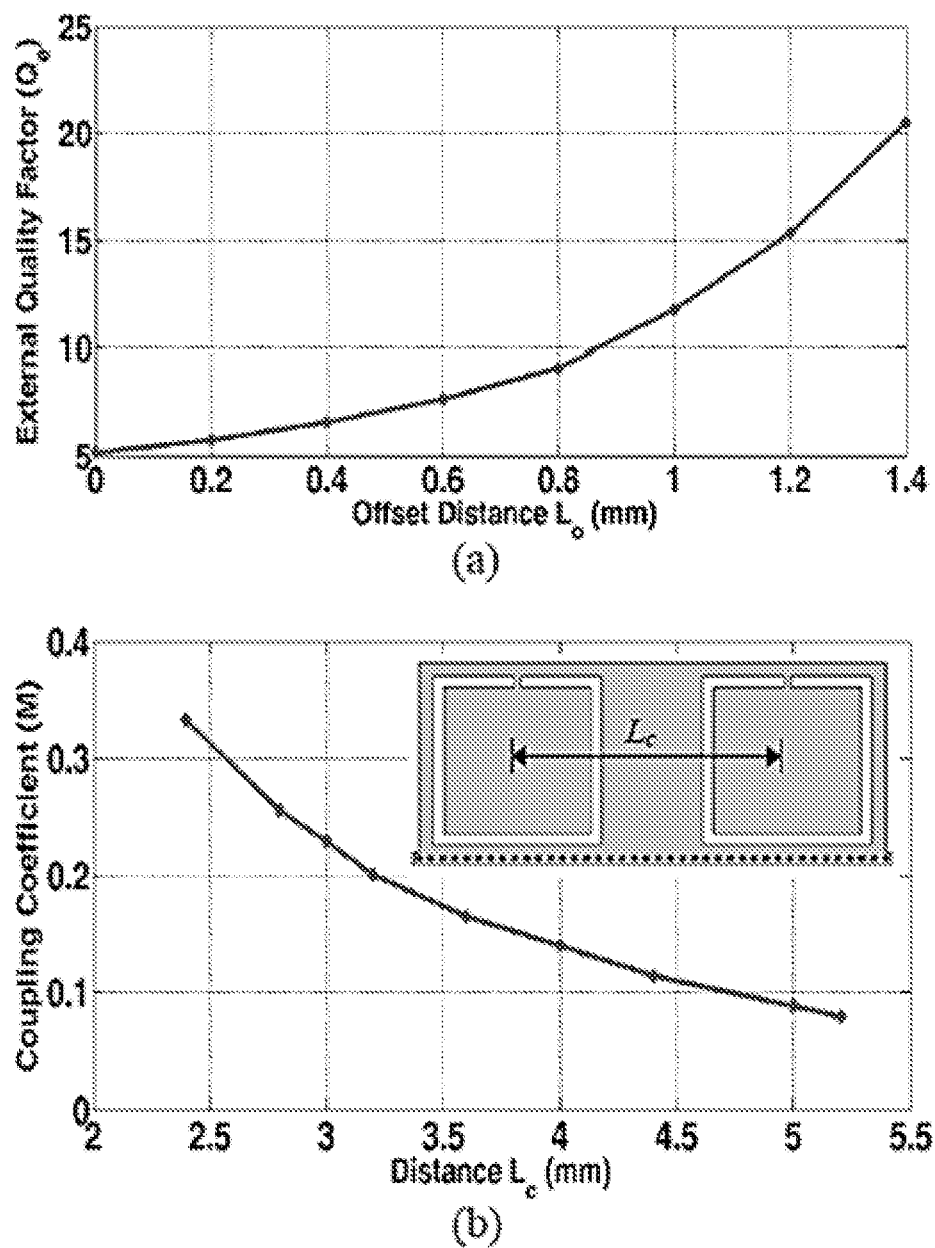
FIGS. 5(a) and 5(b) are plots of examples of external quality factor and coupling coefficient for a two-pole bandpass filter in accordance with various embodiments of the present disclosure.

The variation of the external quality factor ($Q_e$) of the CSRR-loaded HMSIW cavity on a glass substrate was determined for the doubly loaded resonator. Microstrip feeding lines with a characteristic impedance of 50 Ω were used to excite the resonator, as previously illustrated in FIG. 1(b). The offset distance $L_o$ (FIG. 1) was used to vary the external quality factor, which represents the distance from the top open side of the cavity to the top point of the feeding line. FIG. 5(a) is a plot illustrating an example of the external quality factor $Q_e$ for a variation of the offset distance $L_o$ from 0 mm to about 1 mm. In comparison with a conventional SIW cavity, the obtained external quality factors $Q_e$ are smaller since the size of the CSRR-loaded HMSIW cavity is also smaller. In this case, a $Q_e$ as low as 5.4 has been achieved, which is not easy to obtain in conventional SIW and HMSIW cavities. The unloaded quality factor $Q_u$ obtained from the simulation of a double loaded cavity was 150, which is comparable to that obtained for low Q factor cavities for broadband filters. The formula used to calculate the $Q_u$ is as follows:

$$Q_u = \frac{Q_e}{1 - |S_{21}|}. \quad (2)$$

An example of the variation of the coupling coefficient M of coupled resonators is shown in the plot of FIG. 5(b). The configuration in the inset of FIG. 5(b) was used for simulation purposes. Two coupled resonators were excited with a high $Q_e$. The inter-resonator distance $L_c$ was used to control the coupling coefficient as illustrated in the inset of FIG. 5(b). The coupling coefficient is obtained for a variation of the distance $L_c$ from about 2.4 mm up to about 5.2 mm. Due to the small size of the cavity, higher coupling coefficients are possible than those that may be obtained with conventional SIW and HMSIW cavities. The single ring CSRR-loaded HMSIW cavity is useful for the design of a bandpass filter with broader bandwidth than those obtained with conventional SIW and HMSIW cavities.

Referring back to FIGS. 3(a) and 3(b), shown are top views of examples of the layout of the two-pole and three-pole Chebyshev BPFs, 303 and 306 respectively. For testing purposes, the grounded coplanar waveguide (GCPW) with a ground-signal-ground pitch of about 150 μm was included in the design. The two-pole filter dimensions were w=2.76 mm, $L_c$=3.76 mm, $L_x$=$L_y$=2.36 mm, $L_o$=0 mm, $L_f$=1.5 mm, s=160 μm, $L_g$=0.7 mm and the three-pole filter dimensions were w=2.78 mm, $L_x$=$L_y$=2.38 mm, $L_{x2}$=2.618 mm, $L_{c12}$=$L_{c23}$=4.1 mm, $L_o$=0 mm. The length $L_x$ of the CSRR of the second resonator in the three-pole filter was optimized to a value of 2.618 mm to fulfill the frequency requirements, as shown in FIG. 3(b). It was observed that the final dimensions of the resonators were not the same as the original dimensions used in the resonator characterization, since optimizations had been done in order to compensate for frequency shift due to the interaction of the resonators.

Figure 6:
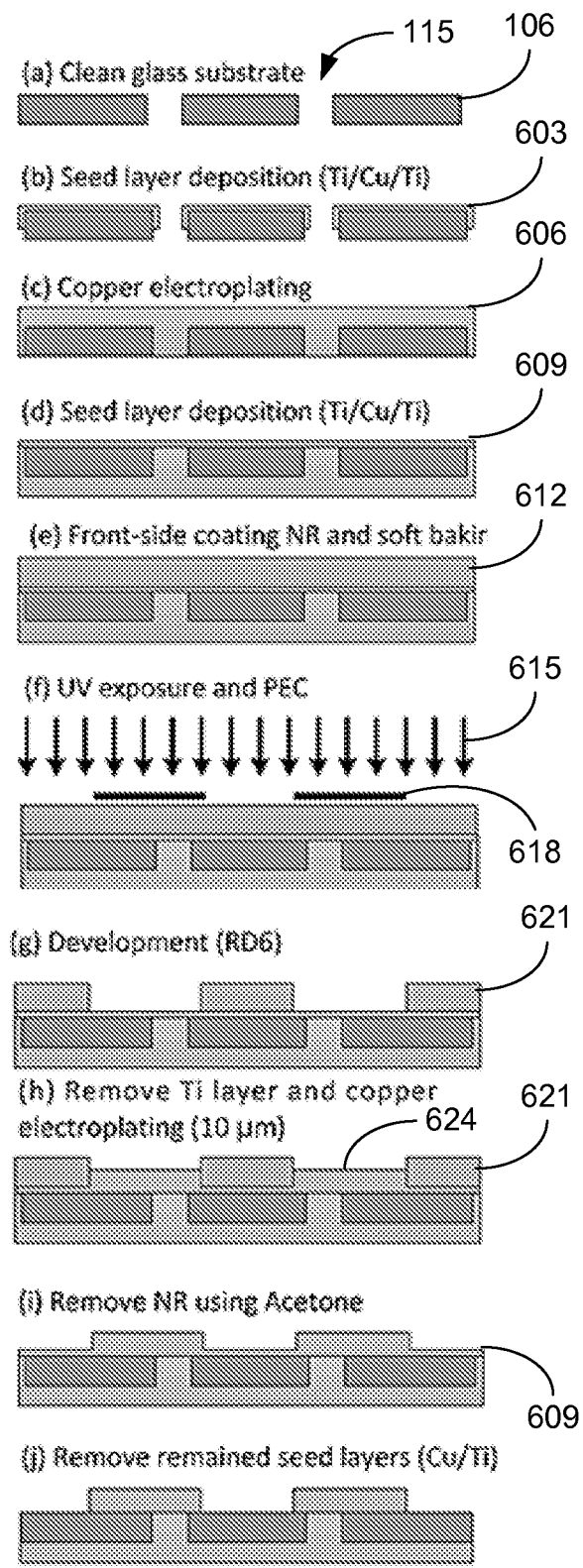
FIGS. 6(a) through 6(j) are graphical representations illustrating an example of fabrication of an electronic component on a glass substrate in accordance with various embodiments of the present disclosure.

Referring next to FIGS. 6(a) through 6(j), shown is an example of the fabrication of an electronic component such as the CSRR-loaded HMSIW resonator 103 and bandpass filters 303 and 306 on a glass substrate 106. As shown in FIG. 6(a), a clean glass substrate 106 is obtained. For example, a 300 μm thick glass substrate 106 can be used. The glass substrate 106 can be fabricated by the Corning fusion process which allows a pristine surface, a thin and strong glass. One or more TGVs 115 can be formed in the glass substrate 106 using optimal fabrication methods such as mechanical, chemical electrical discharge and various types of laser drilling. FIG. 7 shows scanning electron microscope (SEM) images of the front and back side of a glass substrate 106 with fabricated TGVs 115. The average diameters of the TVGs 115 on the front side and back side were 80.79 μm and 75.60 μm, respectively, with a pitch of about 160 μm. Also, average circularity of the TVGs 115 on the front and back sides were 2.11 μm and 1.13 μm, respectively.

Returning to FIG. 6(b), on the glass substrate 106 with 100 μm diameter TGVs 115, a thin film of, e.g., titanium (Ti)/copper (Cu)/titanium (Ti) (50 nm/500 nm/50 nm) is deposited on one side of the glass substrate 106 as a seed layer 603 using a sputtering system (e.g., Kurt J. Lesker CMS-18) after cleaning the glass substrate 106. After removing the first Ti layer, copper electroplating is performed in FIG. 6(c) to fill the TGVs up with copper 606. The thick copper layer 606 on top of the glass substrate 106 can form a ground plane 112 (FIG. 1). A seed layer 609 of, e.g., titanium (Ti)/copper (Cu)/titanium (Ti) (50 nm/500 nm/50 nm) is deposited on the other side of the glass substrate 106 in FIG. 6(d) for patterning the top filter (or signal) layer 109 (FIG. 1). A negative ton photoresist 612 (e.g., NR2-8000P) is spin coated on the front-side of the glass substrate 106, followed by soft baking at 120° C. for 10 minutes as illustrated in FIG. 6(e).

In FIG. 6(f), i-line light 615 (light wavelength=365 nm) is used for exposure through the pattern 618, and post-exposure bake is performed at 80° C. for 5 minutes. After development with a development solution such as, e.g., RD6, the cross-linked areas 621 remain on the glass substrate 106 as shown in FIG. 6(g). One more copper electroplating is performed to increase the copper thickness 624 in the voids formed by the cross-linked photoresist 621 as illustrated in FIG. 6(h). For example, the copper thickness can be increased to about 17 μm. After removing the remained photoresist 621 in FIG. 6(i) and seed layers 609 in FIG. 6(j), the electronic component (e.g., a bandpass filter) is fabricated as shown in FIG. 8. FIG. 8(a) is a SEM image of a fabricated CSRR-loaded HMSIW resonator. FIG. 8(b) is an optical image of a glass substrate 106 with a variety of fabricated HMSIW resonators and BPFs. In some implementations, a second signal layer may be formed instead of the ground plane 112 using a patterning process similar to that described with respect to FIGS. 6(e) through 6(j) after the seed layer 603 is deposited in FIG. 6(b).

Figure 9A:
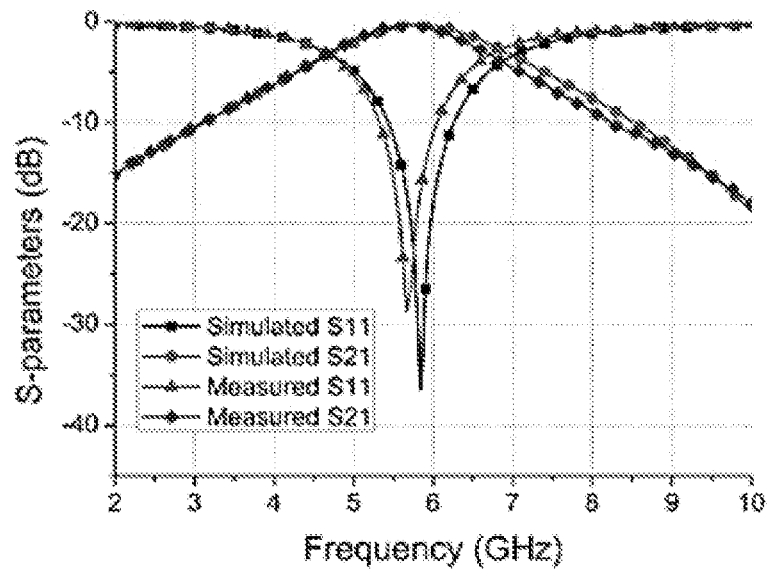
FIGS. 9A-9C are plots of simulation and measured results for examples of a resonator, a two-pole bandpass filter, and a three-pole bandpass filter in accordance with various embodiments of the present disclosure.
Figure 9B:
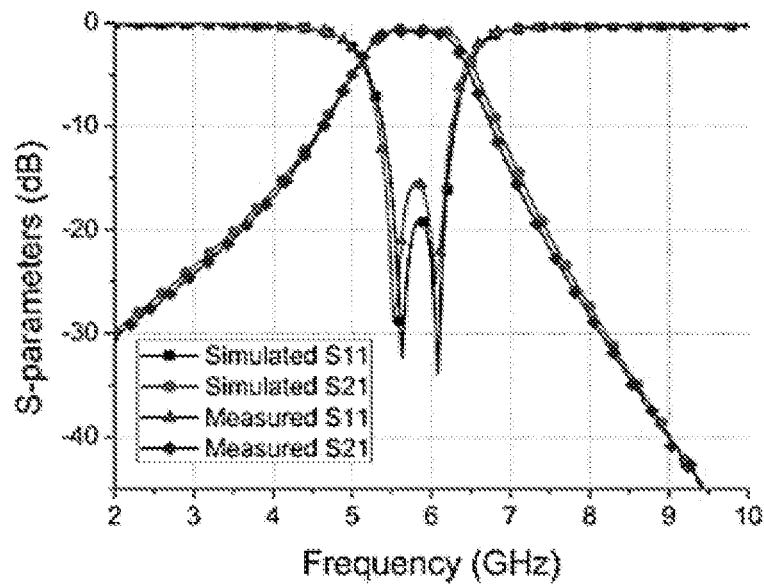
Figures 9C, 10:
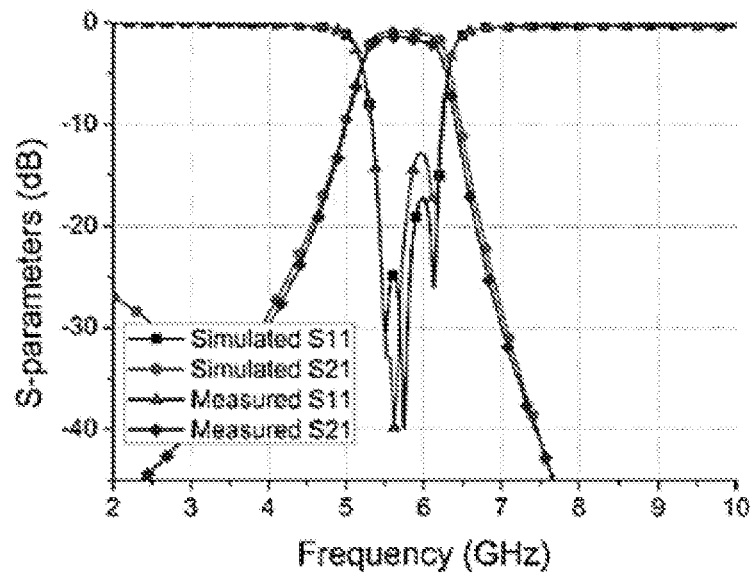
FIG. 10 is a table listing a summary of simulation and measurement results for electronic components on a glass substrate in accordance with various embodiments of the present disclosure.

Full wave structure simulations were compared with measured results and are presented from 2 GHz to 10 GHz in FIGS. 9A-9C. Measurements were performed using a vector network analyzer (E5071C, Agilent, Inc.) after a standard two ports short-open-load-thru (SOLT) calibration between 2 GHz and 10 GHz. A Cascade Microtech probe station with a ground-signal-ground (GSG) pitch of 150 μm was used for testing. FIG. 9A shows the results for the CSRR-loaded HMSIW resonator 103 (FIG. 1) with a size of $0.122\lambda_g \times 0.122\lambda_g$ at 5.8 GHz. It was observed that there is a slight frequency shift between the simulated and measured results. A resonance frequency of 5.63 GHz was measured with an insertion loss of 0.35 dB and a return loss of 28.7 dB. Differences with simulated results may be attributed to tolerance in the fabrication process and the variation of the dielectric constant of the glass substrate 106 (FIG. 1). A 3 dB bandwidth and external quality factor, $Q_e$, of 1.95 GHz (over a range of 4.49-6.64 GHz) and 5.76, respectively, are obtained for the HMSIW resonator 103. An unloaded quality factor $Q_u$ of 144 was obtained from measurements.

Next, the simulated and measured S-parameters of the two and three pole bandpass filters 303 and 306 (FIG. 3) are shown in FIGS. 9B and 9C, respectively. The two-pole BPF 303 has a size of $0.1285\lambda_g \times 0.285\lambda_g$ and the three-pole BPF 303 has a size of $0.1294\lambda_g \times 0.496\lambda_g$ at 5.8 GHz. The measured resonance frequency of the two pole filter 303 was 5.76 GHz with an in-band insertion loss of 0.79. A 3 dB bandwidth of 1.22 GHz was observed (over a range of 5.15-6.37 GHz), which represents a 3 dB FBW of 21.18%. In band return loss better than 15 dB was obtained. The measured center frequency of the three pole filter 306 was 5.81 GHz with an insertion loss of 1.35 dB. A measured 3 dB bandwidth of 1.1 GHz (over a range of 5.2-6.3 GHz) was obtained, which gives a 3 dB FBW of 18.9%. The details for the CSRR-loaded HMSIW resonator 103, the two-pole BPF 303 and the three-pole BPF 306 are summarized in Table 2 of FIG. 10.

The implementation of compact high quality RF electronic devices on Corning glass substrates has been presented. Substrate integrated waveguide architectures in combination with metamaterial particles have been selected to realize compact resonators and bandpass filters working under the principle of the evanescent wave amplification. Compact devices with broadband operation were achieved with the use of the HMSIW architecture loaded with a single ring complementary split ring resonator. A through-glass via (TGV) process and a surface micromachined Chebyshev BPF were demonstrated for the implementation of BPFs operating at 5.8 GHz with more than 10% FBW and 20 dB RL. Measurement results presented from 2 GHz to 10 GHz show good agreement with simulated results.

Wireless intra-chip/inter-chip interconnections using on-chip antenna integrated on silicon interposer for three dimensional (3D) stacked chip packaging may be used to solve the problems caused by wire bonding. For example, a patch type antenna array may be designed on silicon interposer for 55-66 GHz frequency range, which is favored for high data-rate applications. Each antenna element can be surrounded by a number of through-silicon vias (TSVs) to reduce the coupling between adjacent antennas. Glass interposers offer a promising alternative to silicon interposers because of its high signal isolation, low dielectric loss and low manufacturing cost. Through-glass vias (TGVs) may be processed by laser drilling and wet and drying etching can be used for 3D packaging instead of TSV.

A monopole antenna loaded with a circular disc can be integrated on a glass interposer layer for millimeter-wave wireless communication applications. A TGV can be used as a main radiator and the circular disc can be used for impedance matching. An omnidirectional radiation pattern formed by the monopole antenna allows in-plane wireless communication whose distance is much larger than 1 cm. This can solve problems such as cross talk and time delay caused by the conventional wire bonding approach. A 77 GHz (W-band) antenna has been designed and fabricated as a prototype on a glass substrate. The simulated peak gain of the antenna is 1.23 dBi. As the antenna architecture is scalable, the same implementation has been used in other applications such as, e.g., 5.8 GHz industrial, scientific and medical, ISM band applications. The design, fabrication, and characterization of the antenna architecture are detailed below. The measured results of the return loss and radiation pattern were found to agree well with the simulation results.

Figure 11:
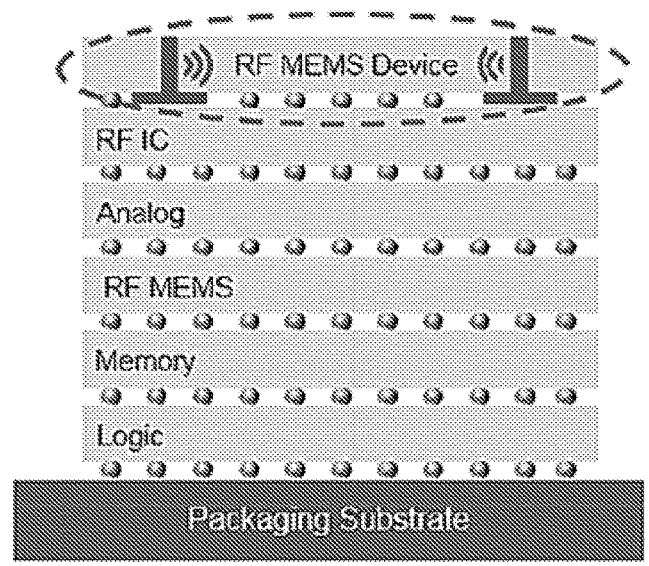
FIG. 11 is a graphical representation of an example of a three-dimensional (3D) glass interposer integration structure in accordance with various embodiments of the present disclosure.

A glass interposer with one or more TGV is demonstrated that work as not only the conventional interconnecting layer for 3D packaging but also as monopole antennas for wireless interposer communications. Referring to FIG. 11, shown is an example of the structure of 3D integration containing a plurality of monopole antenna on a glass substrate located at the top of the structure. The TGV can be utilized as the monopole antenna and a cylindrical disk-shaped metal plate can be loaded on the bottom of the glass substrate so that the TGV and the disk-shaped metal plate serve as a disk-loaded monopole antenna. The disk-loaded monopole antenna makes it possible to significantly reduce the height of the monopole antenna while still giving the same performance, which enables compact and low cost wireless interconnections on glass interposer for 3D packaging.

The disk-loaded monopole antenna transmits and receives data in both near and far field regions at a high rate, which may not be achievable by the wired interconnects due to delay caused by crosstalk. The monopole antenna has an omnidirectional radiation pattern and radiates equal power in all directions, which results in far field transmission whose distance can be longer than 1 cm. As a test vehicle, a disk-loaded monopole antenna was designed on a glass substrate for 76-77 GHz (W-band) and another antenna working at 5.8 GHz (ISM band) was also designed on a commercial substrate to demonstrate the scalability of the disc loaded monopole antenna. Full wave structure simulation results obtained by using the High Frequency Structure Simulator (HFSS, ANSYS Inc.) are compared with measurement results.

Figure 12A:
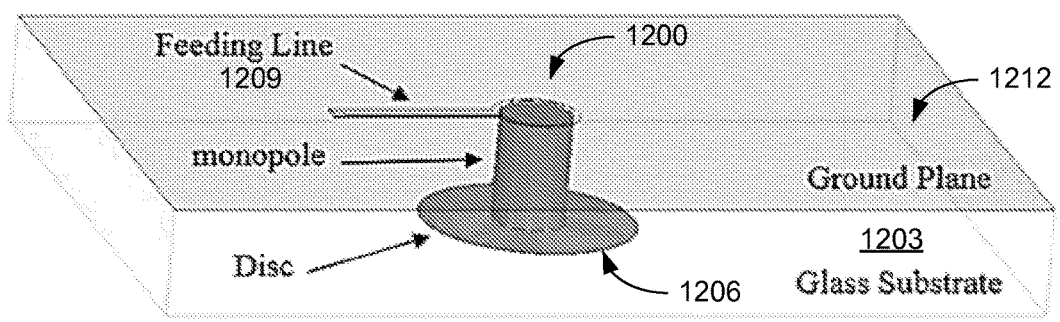
FIGS. 12A-12C include graphical representations of (a) perspective, (b) top and (c) cross-sectional views of an example of a disc-loaded monopole antenna on glass substrate in accordance with various embodiments of the present disclosure.
Figure 12B:
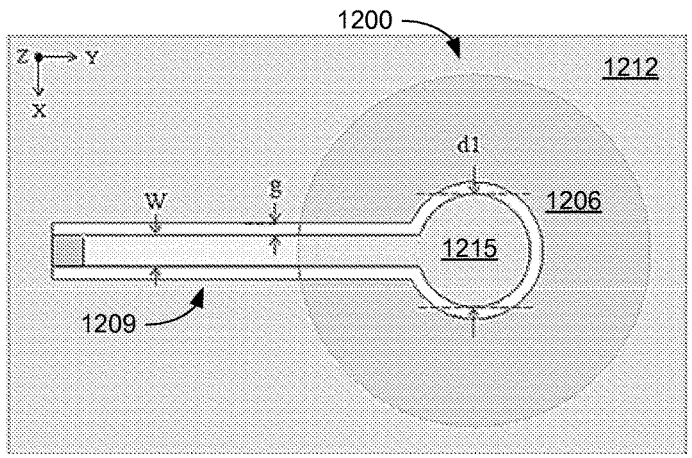
Figure 12C:
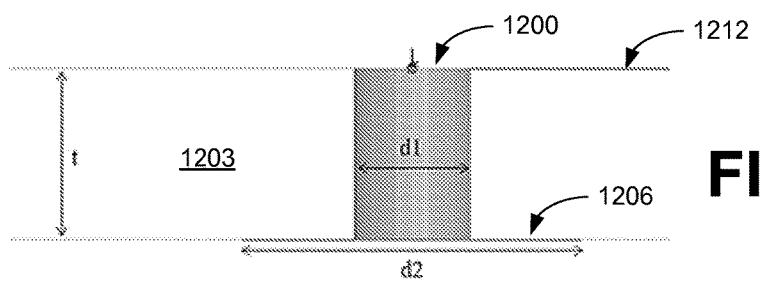

Referring to FIGS. 12A through 12C, shown is an example of a disc-loaded monopole antenna 1200 on a glass substrate 1203. FIG. 12A is a perspective view, FIG. 12B is a top view and FIG. 12C is a cross-sectional view of the antenna 1200. When the thickness of glass substrate 1203 is smaller than a quarter wavelength monopole antenna, the antenna 1200 becomes a vertical electrically short monopole antenna, resulting in less current on the antenna 1200 compared to the current on a quarter wavelength monopole antennas. In order to increase the current flowing in the electrically short monopole antenna 1200, a capacitive disc 1206 can be loaded at the tip of the monopole antenna 1200 integrated on glass substrate 1203. With the capacitive disc loading, the current and radiation resistance of the antenna 1200 can be increased, allowing the antenna 1200 to radiate more power. Therefore, the disc-loaded monopole antenna 1200 can be integrated in any thickness of glass substrate 1203 while still exhibiting good performance.

FIG. 2A illustrates the geometry of a disc-loaded monopole antenna 1200. The antenna 1200 is designed on a glass substrate 1203 with a relative electrical permittivity $\in_r$ of 5.8, a loss tangent tan δ of 0.0036, and a thickness (t) of 400 μm. The resonant frequency of the antenna 1200 is 76-77 GHz (W-band) for millimeter wave radar system applications. Since the thickness (t) of 400 μm is not enough to work as the height of a quarter-wave length monopole antenna working at 77 GHz, the capacitive disc 1206 is loaded at the tip of the monopole antenna 1200 to make the antenna more efficient. In the example of FIG. 2A, the diameter (d1) of the via working as a monopole antenna 1200 is 180 μm and a diameter (d2) of the disc 1206 is 0.56 mm. A coplanar waveguide (CPW) feeding line 1209 is used to excite the antenna 1200. Dimensions of the CPW feeding line 1209 are W=0.05 mm and g=0.02 mm. The overall dimension size including the ground plane 1212 is 3 mm×3 mm. Top and cross-sectional views are shown in FIGS. 12B and 12C, respectively. The disc-loaded monopole antenna 1200 was designed and simulated using the HFSS (ANSYS Inc.).

Figure 13:
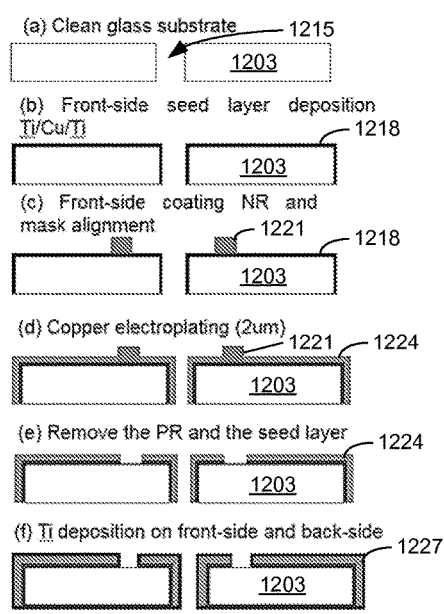
FIG. 13(a) through 13(j) are graphical representations illustrating an example of fabrication of the disc-loaded monopole antenna of FIGS. 12A-12C on a glass substrate in accordance with various embodiments of the present disclosure.
Figure 13:
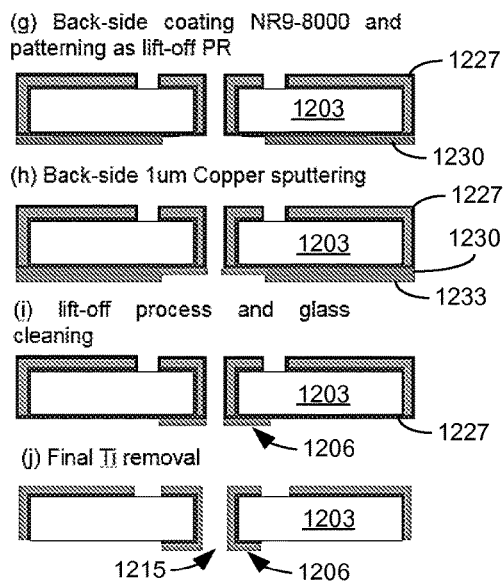

Referring now to FIG. 13, shown is an example of a fabrication process of 77 GHz disc-loaded monopole antenna 1200 of FIGS. 12A-12C. A glass substrate 1203 (FIGS. 12A-12C) processed by fusion forming was provided by Corning Inc. The fusion formed glass substrate 1203 is thin and strong and has high quality of pristine surface. FIGS. 13(a) through 13(j) depict the micro fabrication process of the antenna 1200 on the glass substrate 1203. This process can be divided into two parts: the front side of the glass substrate 1203 and via fabrication process for CPW feeding line 1209 and TGV 1215, and the back side of the glass substrate fabrication process for a circular disc 1206.

Beginning with FIG. 13(a), TGVs 1215 are formed in the glass substrate 1203 using several techniques such as, e.g., mechanical (drill), chemical (wet chemical and plasma), electrical discharge and/or laser drilling. For example, 180 μm via holes 1215 can be formed. In order to fabricate the feeding line 1209 and TGV 1215, titanium (Ti)/copper(Cu)/titanium(Ti) (e.g., about 30 nm/300 nm/30 nm) is deposited as a seed layer 1218 on the front side of the cleaned glass substrate 1203 as shown in FIG. 13(b). A negative photo resist (e.g., NR2-8000P) can then be spin coated on the front side of the glass substrate 1203 and soft baking is performed at 120° C. for 10 minutes. After an exposure process using UV light (e.g., 365 nm), a post-exposure baking is performed at 80° C. for 5 minutes. Development RD6 can be used to remove the unexposed photo resist area, leaving the photoresist pattern 1221 as illustrated in FIG. 13(c).

A layer of copper 1224 is electroplated (e.g., about 2 μm thick) on the front side of the glass substrate 1203 and on the sides of the TGV 1215 in FIG. 13(d), and the remaining photo resist 1221 and seed layer 1218 are removed in FIG. 13(e). Also, for a circular disc fabrication, a layer of Ti 1227 is deposited on the front side and back side of the glass substrate 1203 in FIG. 13(f). Negative photo resist 1230 (e.g., NR2-8000P) can be spin coated on the back side of the glass substrate 1203 and soft baking performed at 120° C. for 10 minutes, followed by post-exposure baking at 80° C. for 5 minutes after exposure process using UV light (e.g., 365 nm). The photo resist area that was unexposed to the UV light is removed by development RD6 as shown in FIG. 13(g). Another layer of copper 1233 (e.g., about 1 μm thick) is sputtered on the back side of the glass substrate 1203 in FIG. 13(h) and the photo resist 1230 and Ti layer 1227 are removed in FIGS. 13(i) and 13(j).

Figure 14A:
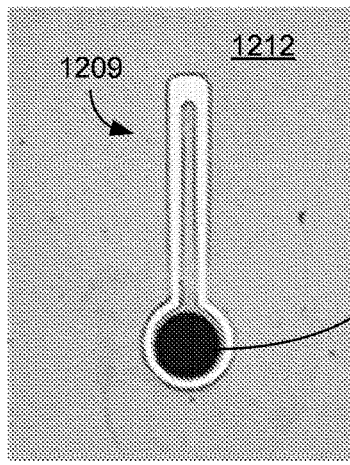
FIGS. 14A-14C are images illustrating an example of a fabricated disc-loaded monopole antenna on glass substrate in accordance with various embodiments of the present disclosure.
Figure 14B:
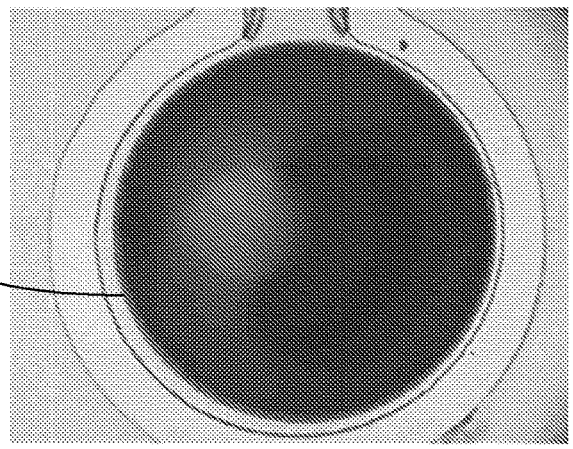
Figure 14C:
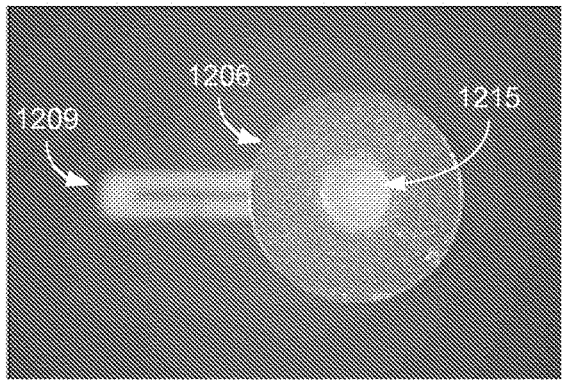

FIGS. 14A through 14C are images of a micro-fabricated disc-loaded monopole antenna 1200 on a glass substrate 1203. FIG. 4A shows a top view of the antenna 1200 including the TGV 1215, CPW feeding line 1209 and ground plane, and FIG. 4B is an image showing the TGV 1215 on the front side of the glass substrate 1203. The copper layer 1224 (e.g., about 2 µm thick) is deposited inside of the via hole 1215. The circular disc 1206 that is used to increase the current of monopole antenna 1200 is shown in FIG. 4C. The disc 1206 is fabricated on the back side of the glass substrate 1203.

Figure 15A:
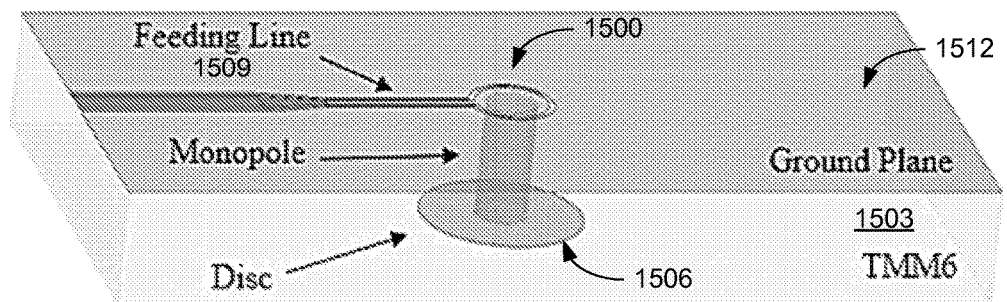
FIGS. 15A-15C include graphical representations of (a) perspective, (b) top and (c) cross-sectional views of an example of a disc-loaded monopole antenna on Rogers TMM6 substrate in accordance with various embodiments of the present disclosure.
Figure 15B:
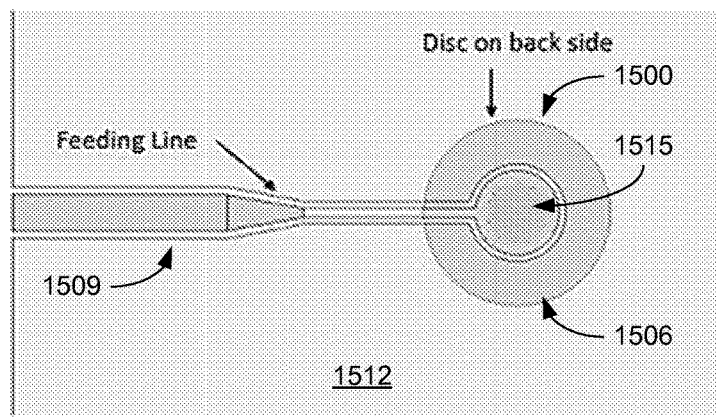
Figure 15C:
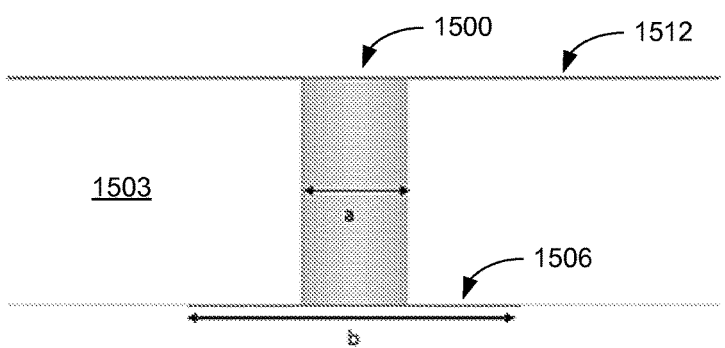

Referring now to FIGS. 15A-15C, shown is another disc-loaded monopole antenna 1500 with the same structure of the 77 GHz (W-band) antenna 1200 was designed for use in the 5.8 GHz ISM band to demonstrate the scalability of the disc-loaded monopole antenna architecture. A Rogers TMM6 laminate with a relative electrical permittivity $\in_r$ of 6 and loss tangent δ of 0.0023 was used as the substrate 1503 to fabricate the 5.8 GHz antenna 1500. As demonstrated by the Rogers substrate 1503, the monopole antenna architecture with a loading disc 1506 on the back side of the substrate 1503 can be implemented using other types of substrates, in addition to the glass substrate 1203 (FIGS. 12A-12C). FIGS. 15A, 15B and 15C show a perspective view, top view and cross-sectional view of the disc-loaded monopole antenna 1500, respectively. A coplanar waveguide (CPW) feeding line 1509 on the ground plane 1512 is used to excite the antenna 1500. In the example of FIGS. 15A-15B, the diameter of the via 1515 working as the monopole antenna is 2.38 mm and the diameter of the disc 1506 loaded at the tip of the antenna 1500 is 6.2 mm.

Figure 16A:
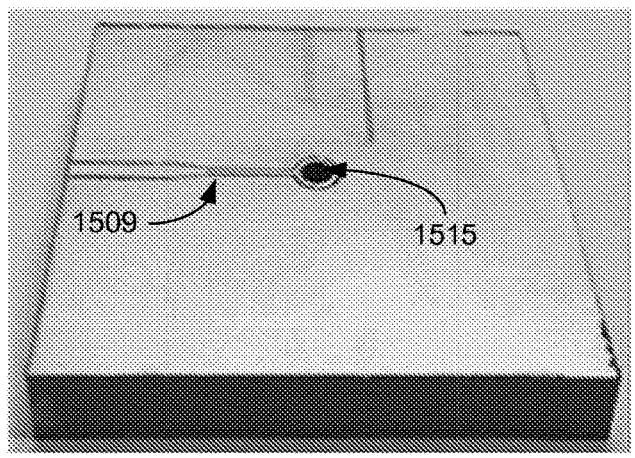
FIGS. 16A-16C are images illustrating an example of a fabricated disc-loaded monopole antenna on Rogers TMM6 substrate in accordance with various embodiments of the present disclosure.
Figure 16B:
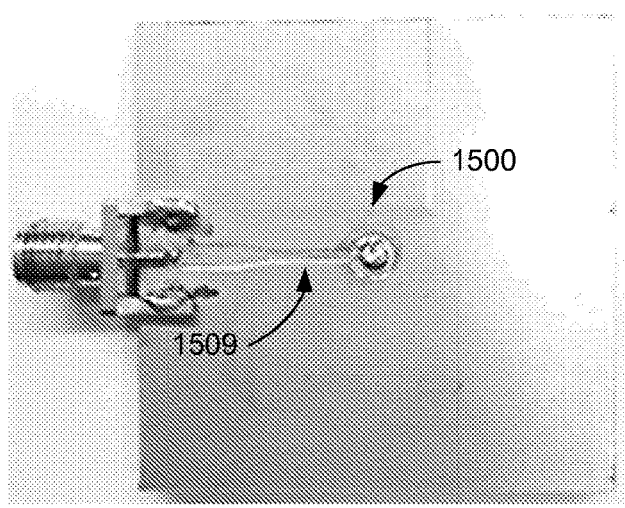
Figure 16C:
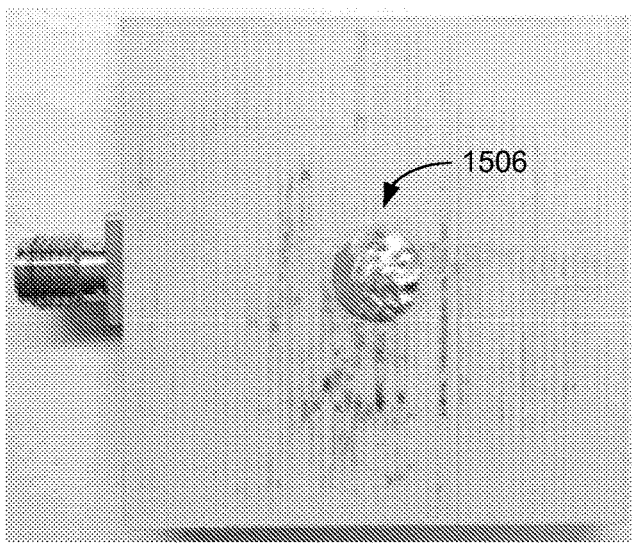

Referring next to FIGS. 16A-16C, shown are images of an example of the 5.8 GHz antenna 1500 that was fabricated by milling machine. A via hole 1515 on the TMM6 substrate 1503 shown in FIG. 6A (before soldering) was fabricated using a drill bit and filled up with solder to realize the monopole antenna 1500 with a diameter of 2.38 mm. FIGS. 6B and 6C show the top view and the bottom view of the antenna 1500 after soldering, respectively.

Figure 17A:
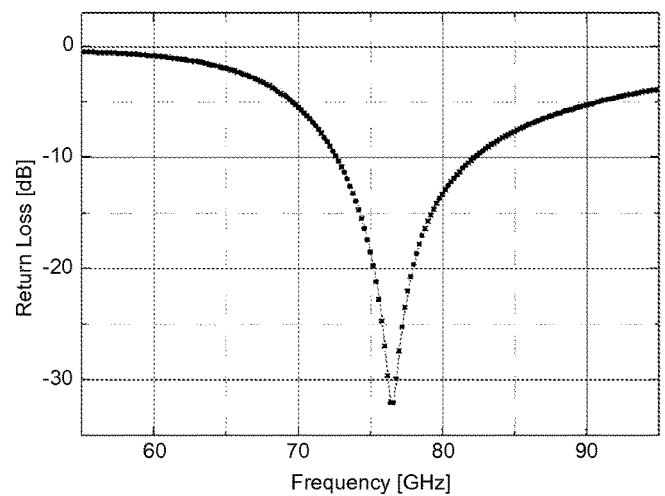
FIGS. 17A-17C are plots illustrating simulated characteristics of a disc-loaded monopole antenna on glass substrate in accordance with various embodiments of the present disclosure.
Figure 17B:
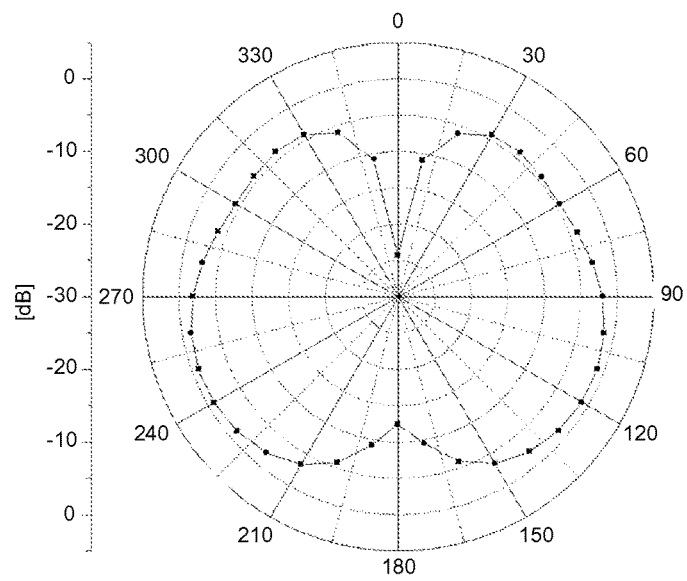
Figure 17C:
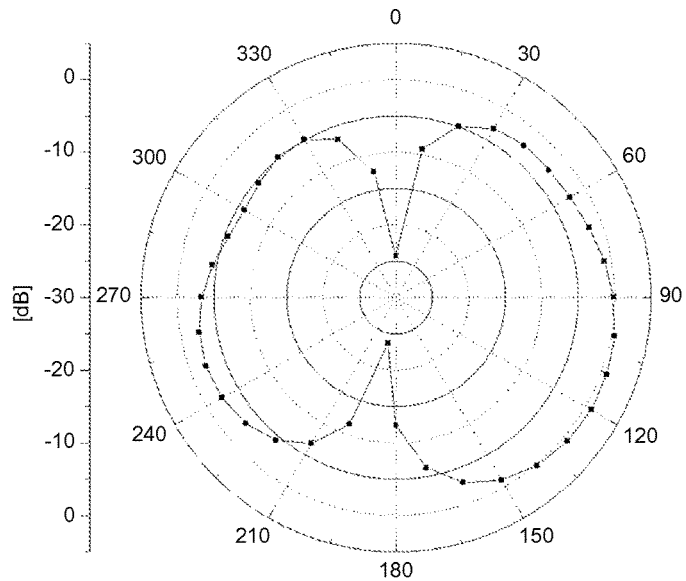

FIG. 17A shows an example of a simulated return loss of the 77 GHz disc-loaded monopole antenna architecture implemented on a glass substrate. The resonance occurs at 77 GHz with a return loss of 32 dB. The 10 dB bandwidth is 7.1% from 76.5 GHz to 82 GHz. FIGS. 17B and 17C show plots of the simulated radiation pattern in the XZ plane and YZ plane at 77 GHz, respectively. A simulated peak gain of 1.23 dB and a radiation efficiency of 94% may be obtained.

Measurement of the return loss and gain of the fabricated 5.8 GHz disc-loaded monopole antenna 1500 was carried out using a vector network analyzer (E5071C, Agilent, Inc.) after a standard two port short-open-load-thru (SOLT) calibration between 2 GHz and 10 GHz. The gain of the antenna 1500 was calculated using the Frii's equation after measuring insertion loss using a horn antenna (JXTXLB-10180, A-INFO Inc.) in the E-plane and H-plane. The ratio of power available at the input of the receiving antenna, $P_r$, to output power to the transmitting antenna, $P_t$, is given by $$\frac{P_r}{P_t} = G_r G_t \left(\frac{\lambda}{4\pi R}\right)^2$$

where $G_r$ and $G_t$ are the antenna gains of the transmitting and receiving antennas respectively, λ is the wavelength, and R is the distance between the antennas.

Figure 18A:
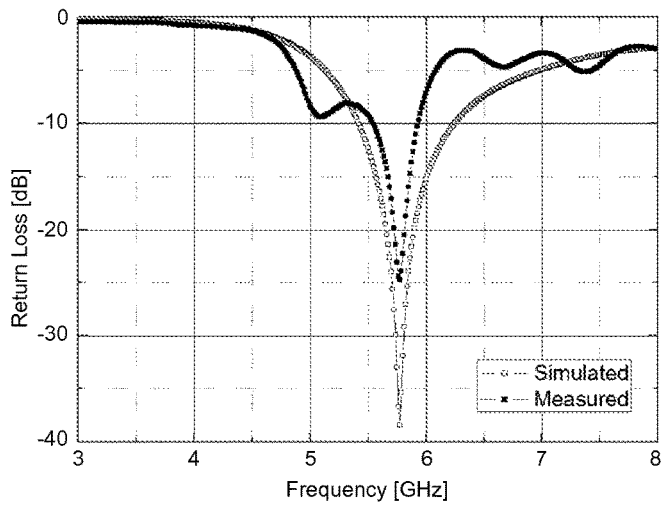
FIGS. 18A-18C are plots illustrating simulated and measured characteristics of a disc-loaded monopole antenna on Rogers TMM6 substrate in accordance with various embodiments of the present disclosure.
Figure 18B:
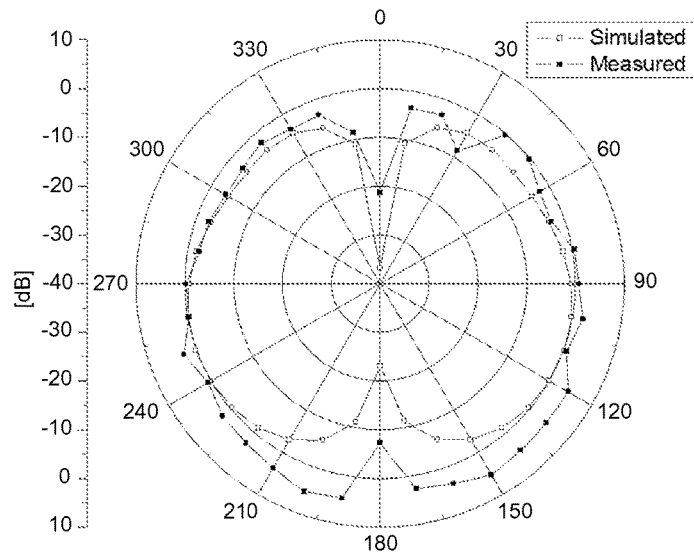
Figure 18C:
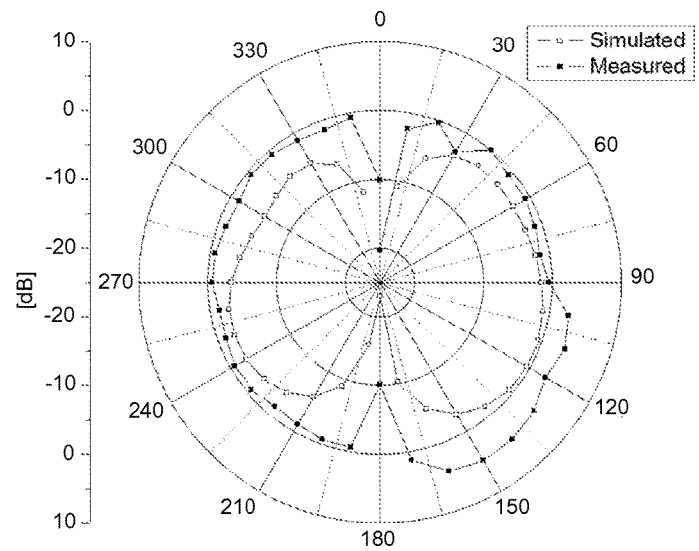

The simulated and measured return losses of the disc-loaded monopole antenna 1500 on the Rogers TMM6 substrate are shown in FIG. 18A. The simulated and measured return losses are 38 dB and 25 dB, respectively. The measured result agrees well with the simulation result. The 10 dB bandwidths of the simulated and measured results are 14.6% (from 5.4 GHz to 6.25 GHz) and 7.4% (from 5.5 GHz to 5.93 GHz), respectively. FIGS. 18B and 18B show the simulated and measured radiation patterns of the antenna 1500 in the XZ plane and YZ plane, respectively. As can be seen from the plots, both radiation patterns are omnidirectional and the measured data agrees well with the simulation result.

A glass interposer-integrated disc loaded monopole antenna for wireless intra/inter chip communication was designed and fabricated for 77 GHz (W-band). TGVs can be used as a monopole antenna which forms omnidirectional radiation pattern, and a disc can be loaded at the bottom of the glass substrate to make the monopole antenna more efficient. The simulated return loss of the antenna was 32 dB and a 10 dB bandwidth of 7.1% was obtained. Omnidirectional radiation patterns in the XZ plane and the YZ plane were observed. Also, in order to demonstrate the scalability of the designed 77 GHz antenna, a 5.8 GHz (ISM band) antenna was designed and implemented on a Rogers substrate. The simulated return loss of the antenna was 38 dB and the measured return loss was 25 dB. The measured radiation pattern of the 5.8 GHz antenna showed good agreement with the simulated radiation pattern. In conclusion, a glass interposer with TGV disk-loaded monopole antenna enables low power dissipation and system miniaturization for 3D IC packaging techniques.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A glass interposer integrated electronic component, comprising:
   a glass substrate;

metal conductor traces disposed on a first side of the glass substrate;

metal conductor traces disposed on a second side of the glass substrate; and a linear array of conductor vias extending through the glass substrate and coupling the metal conductor traces disposed on the first side and the metal conductor traces disposed on the second side of the glass substrate thereby implementing a substrate integrated waveguide in the glass substrate.

2. The glass interposer integrated electronic component of claim 1, wherein the metal conductor traces disposed on the first and second sides comprise copper traces.

3. The glass interposer integrated electronic component of claim 2, wherein the copper traces are electroplated.

4. The glass interposer integrated electronic component of claim 3, wherein the electroplated copper traces are about 10 μm thick.

5. The glass interposer integrated electronic component of claim 1, wherein the metal conductor traces disposed on the second side of the glass substrate form a ground plane.

6. The glass interposer integrated electronic component of claim 1, wherein the substrate integrated waveguide comprises a half mode substrate integrated waveguide, a quarter mode substrate integrated waveguide, or an eighth mode substrate integrated waveguide.

7. The glass interposer integrated electronic component of claim 1, wherein the metal conductor traces disposed on the first side of the glass substrate form a complementary split ring resonator.

8. The glass interposer integrated electronic component of claim 7, wherein the complementary split ring resonator comprises an input feed located on a first side of the glass interposer integrated electronic component and an output feed located on a second side of the glass interposer integrated electronic component opposite the first side.

9. An electronic device, comprising:
a glass interposer;
a signal layer disposed on a first side of the glass interposer; and
a second side layer disposed on a second side of the glass interposer, the second side opposite the first side, the signal layer and the second side layer connected by a linear array of metalized through-glass vias forming a side-wall thereby defining an electromagnetic waveguide in the glass interposer.

10. The electronic device of claim 9, further comprising at least one metalized through-glass via forming a disc loaded monopole antenna, wherein the second side layer comprises a load disc coupled to the at least one metalized through-glass via.

11. The electronic device of claim 10, wherein the signal layer comprises a feeding line coupled to the at least one metalized through-glass via.

12. The electronic device of claim 9, wherein the second side layer comprises a ground plane.

13. The electronic device of claim 12, wherein the glass interposer comprises fusion glass.

14. The electronic device of claim 13, wherein the glass interposer is about 300 μm thick.

15. The electronic device of claim 12, wherein the signal layer comprises a half mode substrate integrated waveguide (HMSIW) resonator loaded with a single ring metamaterial resonator.

16. The electronic device of claim 15, wherein the single ring metamaterial resonator is a complementary split ring resonator (CSRR).

17. The electronic device of claim 15, wherein the HMSIW resonator comprises an input feed located on a first side of the resonator and an output feed located on a second side of the resonator opposite the first side.

18. The electronic device of claim 12, wherein the signal layer comprises a two-pole bandpass filter comprising a plurality of metamaterial resonators.

19. The electronic device of claim 12, wherein the signal layer comprises a three-pole bandpass filter comprising a plurality of metamaterial resonators.

* * * * *